United States Patent
Dosluoglu

(10) Patent No.: US 7,176,532 B2
(45) Date of Patent: Feb. 13, 2007

(54) CMOS ACTIVE PIXEL SENSOR WITH IMPROVED DARK CURRENT AND SENSITIVITY

(75) Inventor: Taner Dosluoglu, New York, NY (US)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 33 days.

(21) Appl. No.: 11/036,937

(22) Filed: Jan. 14, 2005

(65) Prior Publication Data

US 2006/0017072 A1 Jan. 26, 2006

Related U.S. Application Data

(60) Provisional application No. 60/590,406, filed on Jul. 22, 2004.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/369; 257/288; 257/371; 257/448; 257/461; 257/462; 257/463

(58) Field of Classification Search .............. 257/448, 257/461–463, 288, 369, 371
See application file for complete search history.

(56) References Cited

U.S. PATENT DOCUMENTS

| | | | | |
|---|---|---|---|---|
| 5,917,218 A | * | 6/1999 | Choi et al. | 257/345 |
| 6,025,237 A | * | 2/2000 | Choi | 438/301 |
| 6,306,700 B1 | * | 10/2001 | Yang | 438/217 |
| 6,545,303 B1 | * | 4/2003 | Scheffer | 257/290 |
| 6,621,064 B2 | | 9/2003 | Chen et al. | 250/214.1 |
| 6,649,950 B2 | | 11/2003 | He et al. | 257/292 |
| 6,750,489 B1 | * | 6/2004 | Merrill | 257/292 |
| 6,933,488 B2 | * | 8/2005 | Pain | 250/214.1 |

(Continued)

*Primary Examiner*—Ida M. Soward
(74) *Attorney, Agent, or Firm*—Saile Ackerman LLC; Stephen B. Ackerman; Larry J. Prescott

(57) ABSTRACT

An active pixel sensor which provides reduced dark current, improved sensitivity, and improved modulation transfer function. An N well, surrounded by a P well is formed in a P type epitaxial substrate. A $P^+$ region is formed extending from within the P well into the substrate leaving a gap between the $P^+$ region and the N well. A gate dielectric is formed covering at least the gap, part of the $P^+$ region, and part of the N well. A gate electrode is formed on the gate dielectric over the gap, part of the $P^+$ region, and part of the N well. The gate electrode is biased so that the region of the substrate under the gate electrode is accumulated with holes and the region of the N well under the gate electrode is depleted of electrons. This will reduce the dark current and improve the sensitivity of the active pixel sensor. In a second embodiment the P type epitaxial substrate is replaced by an N type epitaxial substrate, the N well is replaced by a P well, $N^+$ regions are replaced by $P^+$ regions, and $P^+$ regions are replaced by $N^+$ regions. In this second embodiment the gate electrode is biased so that the region of the substrate under the gate electrode is depleted of electrons and the region of the P well under the gate electrode is accumulated with holes.

18 Claims, 2 Drawing Sheets

U.S. PATENT DOCUMENTS

| | | |
|---|---|---|
| 6,972,457 B1 * | 12/2005 | Hopper et al. ............... 257/318 |
| 7,019,377 B2 * | 3/2006 | Tsuchiko .................... 257/476 |
| 2002/0094599 A1 * | 7/2002 | Hynecek ..................... 438/79 |
| 2002/0171097 A1 * | 11/2002 | Chen et al. .................. 257/292 |
| 2004/0046104 A1 | 3/2004 | Rhodes .................... 250/208.1 |

* cited by examiner

CMOS ACTIVE PIXEL SENSOR WITH IMPROVED DARK CURRENT AND SENSITIVITY

This Patent Application claims priority to the following U.S. Provisional Patent Application, herein incorporated by reference:

60/590,406, filed Jul. 22, 2004.

BACKGROUND OF THE INVENTION (1) Field of the Invention

This invention relates to an active pixel sensor fabricated using standard CMOS processing and more particularly to dark current suppression and improved sensitivity in active pixel sensors fabricated using standard CMOS processing.

(2) Description of the Related Art

U.S. Pat. No. 6,649,950 B2 to He et al. describes substantially covering the surface of a photodiode structure in order to reduce dark current due to surface damage to the photodiode structure.

U.S. Pat. No. 6,621,064 B2 to Chen et al. describes a device utilizing a buried junction away from the surface to reduce dark current.

U.S. Patent Application Publication No. US 2004/0046104 A1 by Rhodes describes a CMOS imager in which the floating diffusion is connected to a gate of a source follower transistor by a doped polysilicon contact to provide a better ohmic contact and reduce leakage into the substrate.

SUMMARY OF THE INVENTION

The use of standard CMOS processing in the fabrication of active pixel sensors has enormous cost advantages. However, active pixel sensors fabricated using standard CMOS processing have a problem with dark current and sensitivity, particularly in applications which require high performance.

It is a principle objective of this invention to provide an active pixel sensor fabricated using standard CMOS processing which has improved sensitivity and reduced dark current.

This objective is achieved by fabricating an N well surrounded by a P well in a P type epitaxial substrate. The N well is located within the inner periphery of the P well. A $P^+$ region is formed extending from within the P well near the inner periphery of the P well to a distance from the edge of the N well, leaving a gap between the $P^+$ region and the N well. A gate dielectric, typically a gate oxide, is formed covering at least the gap between the $P^+$ region and the edge of the N well. A gate electrode is formed on the gate dielectric over the gap between the $P^+$ region and the edge of the N well and part of the N well. The gate electrode is typically formed from polysilicon.

The gate electrode is biased so that the region of the substrate under the gate electrode is accumulated with holes and the region of the N well under the gate electrode is depleted of electrons. This will reduce the dark current and improve the sensitivity of the active pixel sensor. The gate electrodes are typically biased at the lowest potential of the structure which in this example is usually ground potential.

In another embodiment this objective is achieved by fabricating a P well surrounded by an N well in an N type epitaxial substrate. The P well is located within the inner periphery of the N well. An $N^+$ region is formed extending from within the N well near the inner periphery of the N well to a distance from the edge of the P well, leaving a gap between the $N^+$ region and the P well. A gate dielectric, typically a gate oxide, is formed covering at least the gap between the $N^+$ region and the edge of the P well. A gate electrode is formed on the gate dielectric over the gap between the $N^+$ region and the edge of the P well and part of the P well. The gate electrode is typically formed from polysilicon.

The gate electrode is biased so that the region of the substrate under the gate electrode is accumulated with electrons and the region of the P well under the gate electrode is depleted of holes. This will reduce the dark current and improve the sensitivity of the active pixel sensor. The gate electrodes are typically biased at the highest potential of the structure which in this example is usually ground potential.

DESCRIPTION OF THE PREFERRED EMBODIMENTS

Figure 1:
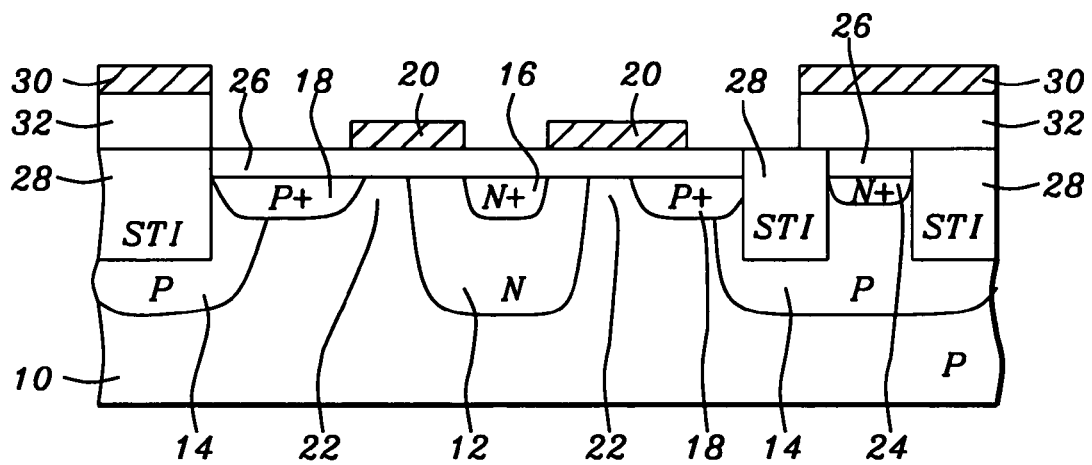
FIG. 1 shows a cross section view of the active pixel sensor of this invention formed in a P type epitaxial substrate.
Figure 2:
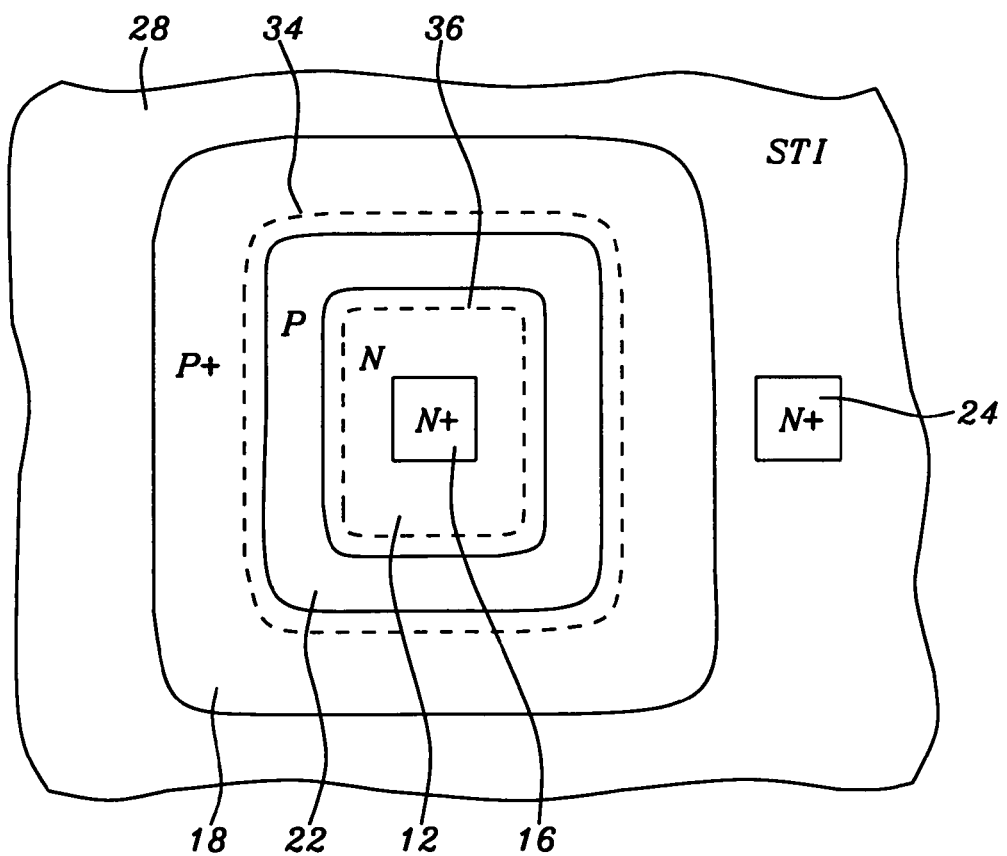
FIG. 2 shows a top view of the active pixel sensor of this invention formed in a P type epitaxial substrate.

Refer now to FIGS. 1 and 2 for a detailed description of a preferred embodiment of this invention. FIG. 1 shows a cross section view of the pixel of this embodiment and FIG. 2 a top view. In this embodiment an N well 12 is formed in a substrate 10 of P type epitaxial silicon. A P well 14 is also formed in the substrate 10 of P type epitaxial silicon and surrounds the N well 12 as can be seen in FIG. 2. The N well 12 is N type silicon and the P well 14 is P type silicon. A first $N^+$ region 16 can be formed in the N well 12 and can be used to make electrical contact to the N well 12. A second $N^+$ region 24, which is not essential to the invention, can be formed in the P well 14. Active devices can be formed in the P well using the second $N^+$ region 24. A $P^+$ region 18 is formed in part of the P well 14 and part of the substrate 10 and surrounds the N well 12 leaving a gap 22 between the inner periphery of the $P^+$ region 18 and the N well 12.

The P well 14 can provide isolation for the pixel but a shallow trench isolation region 28 can also be formed in the P well 14 to provide isolation for the pixel. A layer of thin gate dielectric 26, usually a gate oxide, covers the surface of the pixel outside the regions of the shallow trench isolation regions so that the thin gate oxide 26 covers the $P^+$ region 18, the first $N^+$ region 16, the second $N^+$ region 24, the gap 22, and the N well 12. Appropriate contacts may be made through the gate dielectric 26 to regions below the gate dielectric 26 as desired. A gate electrode 20 is formed on the gate dielectric 26 over the gap 22 between the $P^+$ region 18 and the N well 12, and extends over part of the N well 12 and part of the $P^+$ region 18. In this example the gate electrode 20 is polysilicon. A metal mask 30, formed on a dielectric 32, can be used to shield the non active parts of the pixel from incident light.

To improve the clarity of FIG. 2 the gate electrode 20, the gate dielectric 26, the metal shield 30, and the dielectric 32 supporting the metal shield 30 are not shown in FIG. 2. Although the gate electrode 20 is not shown in FIG. 2, the location of the gate electrode is shown by the dashed lines 34 and 36 with the gate electrode being located between the dashed lines 34 and 36.

The P⁺ region 18 is the key feature in this embodiment of the invention and is used to reduce the dark current and improve the sensitivity of the pixel. Ideally the P⁺ region 18 extending all the way to the N well 12 would provide a surface saturated with holes and prevent the surface states from contributing to dark current generation. However, overlapping the P⁺ region 18 with the N well 12 would produce a low breakdown junction and cause dark current generation at the junction. This is avoided by leaving a gap 22 between the P⁺ region 18 and the N well 12, covering the gap 22 with the gate electrode 20. With the proper bias applied to the gate electrode 20 the region of the substrate under the gate electrode 20 is accumulated with holes and the region of the N well 12 under the gate electrode 20 is depleted of electrons. This will reduce the dark current of the active pixel sensor. The gate electrode 20 is typically biased at the lowest potential of the structure, often ground potential.

The electrons that are generated in the depletion region around the N well 12 will be collected in that N well 12 to P substrate 10 diode, whereas the electrons that are generated outside the depletion region (e.g. deeper in the substrate) will be able to diffuse into adjacent pixels and even possibly recombine without being collected. Since the entire region around the N well 12 is covered by a thin gate dielectric 26, the depth of silicon that is depleted in this pixel is increased resulting in improved sensitivity as well as improved modulation transfer function.

Figure 3:
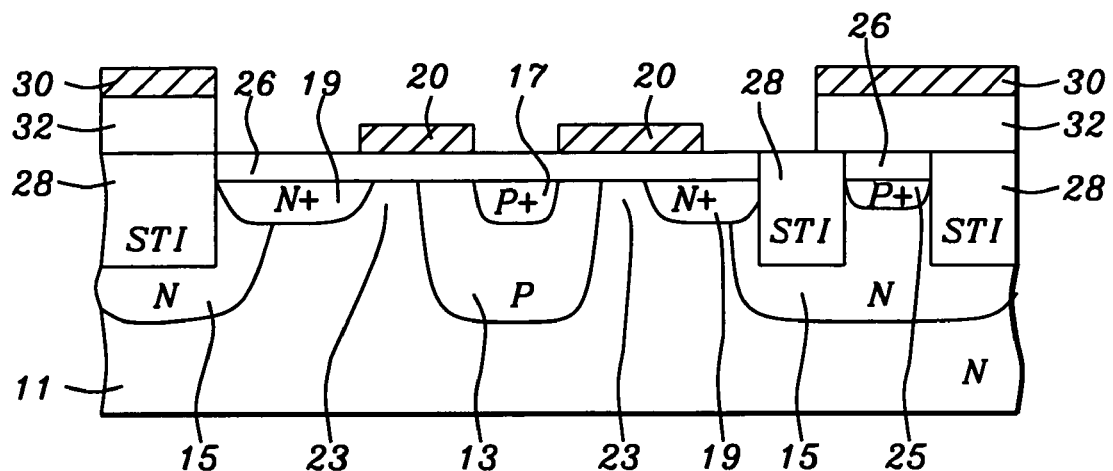
FIG. 3 shows a cross section view of the active pixel sensor of this invention formed in an N type epitaxial substrate.
Figure 4:
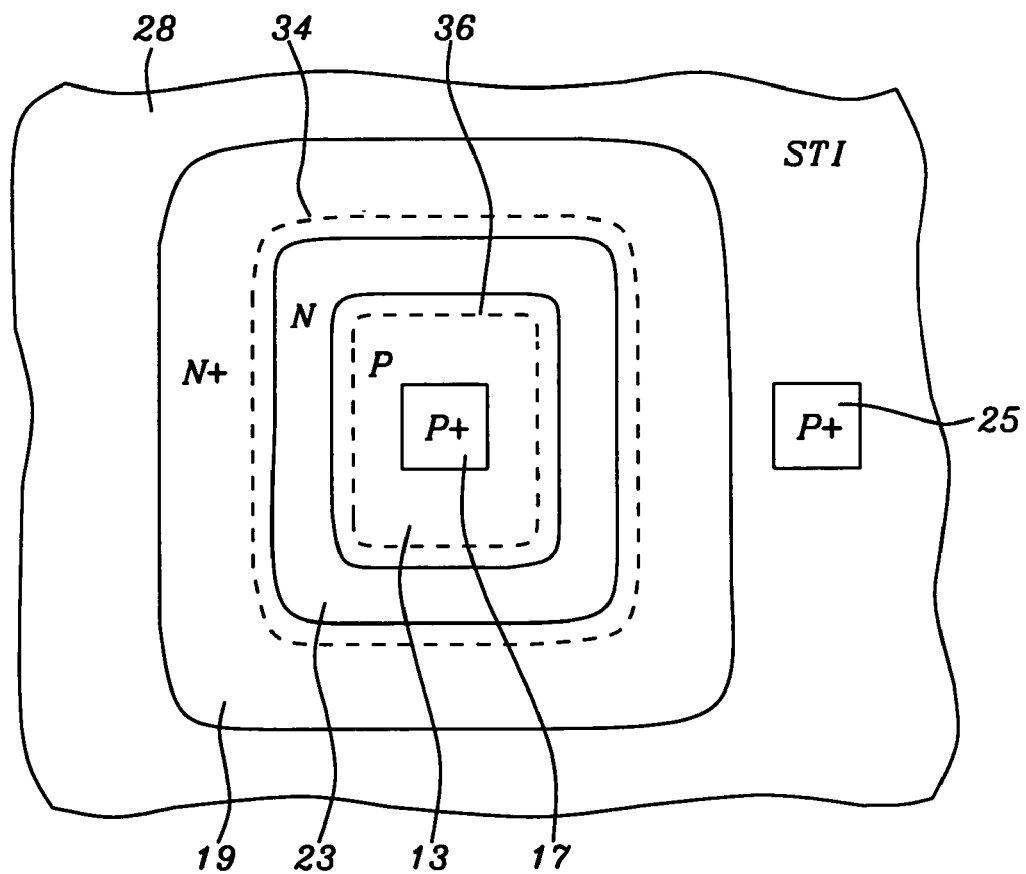
FIG. 4 shows a top view of the active pixel sensor of this invention formed in an N type epitaxial substrate.

Refer now to FIGS. 3 and 4 for a detailed description of another preferred embodiment of this invention. FIG. 3 shows a cross section view of the pixel of this embodiment and FIG. 4 a top view. In this embodiment a P well 13 is formed in a substrate 11 of N type epitaxial silicon. An N well 15 is also formed in the substrate 11 of N type epitaxial silicon and surrounds the P well 13 as can be seen in FIG. 4. The P well 13 is P type silicon and the N well 15 is N type silicon. A first P⁺ region 17 can be formed in the P well 13 and can be used to make electrical contact to the P well 13. A second P⁺ region 25, which is not essential to the invention, can be formed in the N well 15. Active devices can be formed in the N well 15 using the second P⁺ region 25. An N⁺ region 19 is formed in part of the N well 15 and part of the substrate 11 and surrounds the P well 13 leaving a gap 23 between the inner periphery of the N⁺ region 19 and the P well 13.

The N well 15 can provide isolation for the pixel but a shallow trench isolation region 28 can also be formed in the N well 15 to provide isolation for the pixel. A layer of thin gate dielectric 26, usually a gate oxide, covers the surface of the pixel outside the regions of the shallow trench isolation regions so that the thin gate oxide 26 covers the N⁺ region 19, the first P⁺ region 17, the second P⁺ region 25, the gap 23, and the P well 13. Appropriate contacts may be made through the gate dielectric 26 to regions below the gate dielectric 26 as desired. A gate electrode 20 is formed on the gate dielectric 26 over the gap 23 between the N⁺ region 19 and the P well 13, and extends over part of the P well 13 and part of the N⁺ region 19. In this example the gate electrode 20 is polysilicon. A metal mask 30, formed on a dielectric 32, can be used to shield the non active parts of the pixel from incident light.

To improve the clarity of FIG. 4 the gate electrode 20, the gate dielectric 26, the metal shield 30, and the dielectric 32 supporting the metal shield 30 are not shown in FIG. 4.

Although the gate electrode 20 is not shown in FIG. 4, the location of the gate electrode is shown by the dashed lines 34 and 36 with the gate electrode being located between the dashed lines 34 and 36.

The N⁺ region 19 is the key feature in this embodiment of the invention and is used to reduce the dark current and improve the sensitivity of the pixel. Ideally the P⁺ region 19 extending all the way to the P well 13 would provide a surface saturated with holes and prevent the surface states from contributing to dark current generation. However, overlapping the N⁺ region 19 with the P well 12 would produce a low breakdown junction and cause dark current generation at the junction. This is avoided by leaving a gap 23 between the N⁺ region 19 and the P well 13, covering the gap 23 with the gate electrode 20. With the proper bias applied to the gate electrode 20 the region of the substrate 11 under the gate electrode 20 is depleted of electrons and the region of the P well 13 under the gate electrode 20 is accumulated with holes. This will reduce the dark current of the active pixel sensor. The gate electrode 20 is typically biased at the highest potential of the structure, often ground potential.

The electrons that are generated in the depletion region around the P well 13 will be collected in that P well 13 to N substrate 11 diode, whereas the electrons that are generated outside the depletion region (e.g. deeper in the substrate) will be able to diffuse into adjacent pixels and even possibly recombine without being collected. Since the entire region around the P well 13 is covered by a thin gate dielectric 26, the depth of silicon that is depleted in this pixel is increased resulting in improved sensitivity as well as improved modulation transfer function.

While the invention has been particularly shown and described with reference to the preferred embodiments thereof, it will be understood by those skilled in the art that various changes in form and details may be made without departing from the spirit and scope of the invention.

What is claimed is:

1. An active pixel sensor, comprising:
   a substrate formed of P type epitaxial silicon;
   an N well formed in said substrate wherein said N well is formed of N type silicon;
   a P well formed in said substrate wherein said P well has an inner periphery and an outer periphery, surrounds said N well, and is formed of P type silicon;
   an N⁺ region formed in said N well, wherein the entire said N⁺ region is within said N well and does not extend beyond said N well;
   a P⁺ region formed in part of said P well and part of said substrate wherein said P⁺ region extends from within said P well into said substrate toward said N well, thereby leaving a gap between said P⁺ region and said N well;
   a layer of gate dielectric formed over said gap, said N well, said N⁺ region, and at least part of said P⁺ region; and
   a gate electrode formed on said layer of gate dielectric over said gap, at least part of said N well, and at least part of said P⁺ region.

2. The active pixel sensor of claim 1 wherein said gate dielectric is formed over all of said P⁺ region.

3. The active pixel sensor of claim 1 wherein said gate dielectric is silicon dioxide.

4. The active pixel sensor of claim 1 wherein said gate electrode is formed of polysilicon.

5. The active pixel sensor of claim 1 further comprising a shallow trench isolation region in said P well.

6. The active pixel sensor of claim 1 further comprising an opaque shield over said active pixel sensor except for said P+ region, said gap, said N region, and said N+ region.

7. The active pixel sensor of claim 6 wherein said opaque shield is a metal shield.

8. The active pixel sensor of claim 1 wherein said gate electrode is held at the lowest potential of the active pixel sensor.

9. The active pixel sensor of claim 1 wherein electrical contact to said N well is made through said N+ region.

10. An active pixel sensor, comprising:
a substrate formed of N type epitaxial silicon;
a P well formed in said substrate wherein said P well is formed of P type silicon;
an N well formed in said substrate wherein said N well has an inner periphery and an outer periphery, surrounds said P well, and is formed of N type silicon;
a P+ region formed in said P well, wherein the entire said P+ region is within said P well and does not extend beyond said P well;
an N+ region formed in part of said N well and part of said substrate wherein said N+ region extends from within said N well into said substrate toward said P well, thereby leaving a gap between said N+ region and said P well;
a layer of gate dielectric formed over said gap, said P well, said P+ region, and at least part of said N+ region; and
a gate electrode formed on said layer of gate dielectric over said gap, at least part of said P well, and at least part of said N+ region.

11. The active pixel sensor of claim 10 wherein said gate dielectric is formed over all of said N+ region.

12. The active pixel sensor of claim 10 wherein said gate dielectric is silicon dioxide.

13. The active pixel sensor of claim 10 wherein said gate electrode is formed of polysilicon.

14. The active pixel sensor of claim 10 further comprising a shallow trench isolation region in said N well.

15. The active pixel sensor of claim 10 further comprising an opaque shield over said active pixel sensor except for said N+ region, said gap, said P region, and said P+ region.

16. The active pixel sensor of claim 15 wherein said opaque shield is a metal shield.

17. The active pixel sensor of claim 10 wherein said gate electrode is held at the highest potential of the active pixel sensor.

18. The active pixel sensor of claim 10 wherein electrical contact to said P well is made through said P+ region.

* * * * *

UNITED STATES PATENT AND TRADEMARK OFFICE
CERTIFICATE OF CORRECTION

PATENT NO. : 7,176,532 B2  Page 1 of 1
APPLICATION NO. : 11/036937
DATED : February 13, 2007
INVENTOR(S) : Taner Dosluoglu It is certified that error appears in the above-identified patent and that said Letters Patent is hereby corrected as shown below:

TITLE PAGE,
In the Assignee (73), delete "Dialog Semiconductor GmbH, Kirchheim/Teck-Nabern (DE)" and replace with --Dialog Imaging Systems GmbH, Kirchheim/Teck-Nabern (DE)--.

Signed and Sealed this

Twenty-ninth Day of January, 2008

JON W. DUDAS
*Director of the United States Patent and Trademark Office*